United States Patent
Tailliet

(10) Patent No.: US 10,892,321 B2
(45) Date of Patent: Jan. 12, 2021

(54) MOS TRANSISTORS IN PARALLEL

(71) Applicant: STMicroelectronics (Rousset) SAS, Rousset (FR)

(72) Inventor: François Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/059,654

(22) Filed: Aug. 9, 2018

(65) Prior Publication Data
US 2019/0058034 A1    Feb. 21, 2019

(30) Foreign Application Priority Data
Aug. 16, 2017   (FR) ...................... 17 57701

(51) Int. Cl.
| H01L 29/76 | (2006.01) |
| H01L 29/06 | (2006.01) |
| H01L 27/088 | (2006.01) |
| H01L 21/762 | (2006.01) |
| H01L 29/10 | (2006.01) |
| H01L 29/78 | (2006.01) |
| H01L 21/8234 | (2006.01) |

(52) U.S. Cl.
CPC .... *H01L 29/0649* (2013.01); *H01L 21/76229* (2013.01); *H01L 21/823481* (2013.01); *H01L 27/088* (2013.01); *H01L 29/1037* (2013.01); *H01L 29/78* (2013.01); *H01L 21/823412* (2013.01)

(58) Field of Classification Search
CPC ............. H01L 29/1037; H01L 29/0649; H01L 21/823481; H01L 27/088; H01L 21/76229
See application file for complete search history.

(56) References Cited

U.S. PATENT DOCUMENTS

| 4,379,305 A | 4/1983 | Mitchell |
| 5,473,186 A | 12/1995 | Morita |
| 2001/0005022 A1 | 6/2001 | Ogura |
| 2007/0111409 A1 | 5/2007 | Watanabe et al. |
| 2009/0203188 A1* | 8/2009 | Shin .................. H01L 21/76229 438/435 |
| 2011/0081782 A1 | 4/2011 | Liang et al. |

(Continued)

FOREIGN PATENT DOCUMENTS

JP    2002118253 A    4/2002

OTHER PUBLICATIONS

U.S. Appl. No. 16/053,304, Selected portions of prosecution history, Aug. 11, 2020, 47 total pages.

(Continued)

*Primary Examiner* — Samuel A Gebremariam
(74) *Attorney, Agent, or Firm* — Slater Matsil, LLP

(57) ABSTRACT

An electronic chip includes first transistors connected in parallel so that gates of the first transistors are interconnected, drain areas of the first transistors are interconnected, and source areas of the first transistors are interconnected. The first transistors are separated from one another by first isolating trenches. The chip also includes second transistors and second isolating trenches. The second transistors are separated from one another by the second isolating trenches. The first isolating trenches have a maximum width that is smaller than a maximum width of all the second isolating trenches.

24 Claims, 2 Drawing Sheets

(56) References Cited

U.S. PATENT DOCUMENTS

2011/0169125 A1  7/2011  Reinmuth
2013/0181297 A1  7/2013  Liaw
2019/0057963 A1  2/2019  Tailliet

OTHER PUBLICATIONS

Search Report for application FR 1757700, Institut National de la Propriete Industrielle, Apr. 24, 2018, 11 total pages.
Search Report for application FR 1757701, Institut National de la Propriete Industrielle, Apr. 24, 2018, 9 total pages.

* cited by examiner

MOS TRANSISTORS IN PARALLEL

CROSS-REFERENCE TO RELATED APPLICATIONS

This application claims priority to French Patent Application No. 1757701, filed on Aug. 16, 2017, which application is hereby incorporated herein by reference.

TECHNICAL FIELD

The present disclosure generally relates to electronic circuits, and more particularly to integrated circuits containing transistors formed of a plurality of transistors connected in parallel.

BACKGROUND

Isolating trenches, and more particularly STI (Shallow Trench Isolation) are currently used in integrated circuits to separate and isolate transistors from one another.

The dimensions of a trench, and more particularly its maximum width, that is, the trench width at the level of the substrate surface where the trench is formed, and its depth, are selected according to the voltage difference that the trench should be able to isolate between its two sides. It is possible to determine, for example, empirically, the smallest dimensions from which the trench isolates two transistors, for a given context of use. Thus, an integrated circuit designer selects design rules setting the dimensions that the trenches separating transistors of a given integrated circuit should have. Trenches having dimensions smaller than the dimensions set by the design rules do not provide a correct isolation and leakage currents appear between neighboring transistors.

SUMMARY

An embodiment overcomes all or part of the disadvantages of usual integrated circuits comprising a plurality of transistors in parallel.

Thus, an embodiment provides an electronic chip comprising first transistors connected in parallel and separated from one another by first isolating trenches and second transistors separated from one another by second isolating trenches. The first isolating trenches have a maximum width smaller than the maximum widths of all the second isolating trenches.

According to an embodiment, the depth of the first isolating trenches is independent from their maximum width.

According to an embodiment, the depth of the first isolating trenches depends on their maximum width.

According to an embodiment, the second transistors are not connected in parallel.

According to an embodiment, the gates of the first transistors are interconnected, the drain areas of the first transistors being interconnected, and the source areas of the first transistors being interconnected.

According to an embodiment, the first and the second transistors have a same channel width.

According to an embodiment, the maximum width of the first trenches is smaller than half the smallest maximum width of the second trenches.

According to an embodiment, at least the first isolating trenches have a cross-section having the shape of an isosceles trapeze.

According to an embodiment, the first isolating trenches have a triangular cross-section.

According to an embodiment, the depth of the second trenches is independent from their maximum width.

According to an embodiment, the maximum width of the second isolating trenches is a function of the isolation desired between the second transistors.

According to an embodiment, the width of the channels of the first transistors is a function of the desired threshold voltage.

According to an embodiment, the electronic chip comprises a plurality of transistors formed of first transistors.

An embodiment provides an electronic circuit comprising a chip such as described hereabove.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
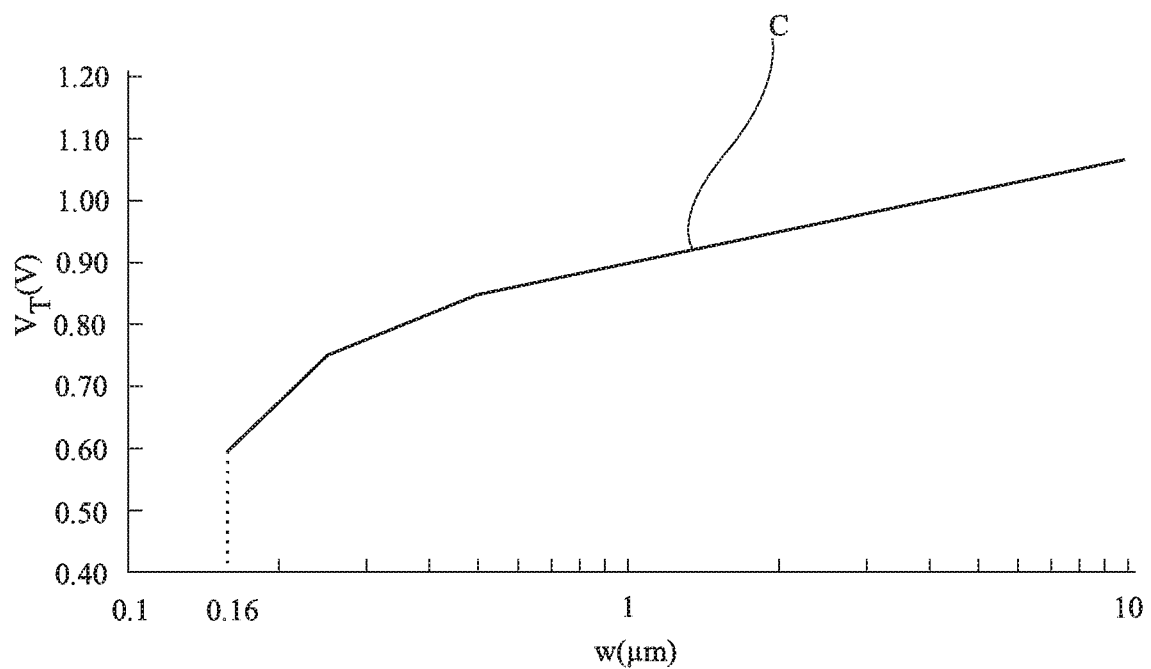
FIG. 1 is a graph showing an example of the shape of the threshold voltage of a reverse narrow channel effect transistor according to the channel width of the transistor.

The same elements have been designated with the same reference numerals in the various drawings and, further, the various drawings are not to scale. For clarity, only those steps and elements which are useful to the understanding of the described embodiments have been shown and are detailed. In particular, the source and drain areas of the transistors are neither described, nor shown.

In the following description, when reference is made to terms qualifying the relative position, such as term "lower", "upper", etc., reference is made to the orientation of the concerned elements in the drawings.

Unless otherwise specified, term "approximately" means to within 10%, preferably to within 5%.

According to the technology and more particularly to the form of the isolation oxide between MOS transistors and the isolation type, the threshold voltage of the transistors varies in direct fashion (so-called "narrow channel effect" transistors) or in reverse fashion (so-called "reverse narrow channel effect" transistors) with the channel width. The present disclosure more particularly aims at reverse narrow channel effect transistors.

FIG. 1 shows a curve C illustrating the variations of the threshold voltage $V_T$, in volts (V), of a reverse narrow channel effect transistor, according to the channel width W, in µm, of this transistor.

Curve C more specifically illustrates the variations of the threshold voltage of an N-type MOS transistor having a gate length, in this example, equal to 0.66 µm. The observations made from this example are however valid for all types of reverse narrow channel effect MOS transistors.

Curve C shows that the value of threshold voltage $V_T$ of the transistor decreases when the value of the channel width W of this transistor is decreased. In the considered example, the threshold voltage decreases from 1.05 V, for a 10-µm channel width, to 0.6 V for a 0.16-µm channel width. This is caused by the reverse narrow channel effect: the smaller the channel width, the stronger the influence of the channel edges and the lower the threshold voltage.

However, the channel width of a transistor conditions the maximum current that the transistor can conduct. To increase the current that can be circulated through a transistor, the channel width thereof can be increased. However, its threshold voltage is also increased. A current solution is to connect in parallel a plurality of transistors having a lower threshold voltage.

Figure 2:
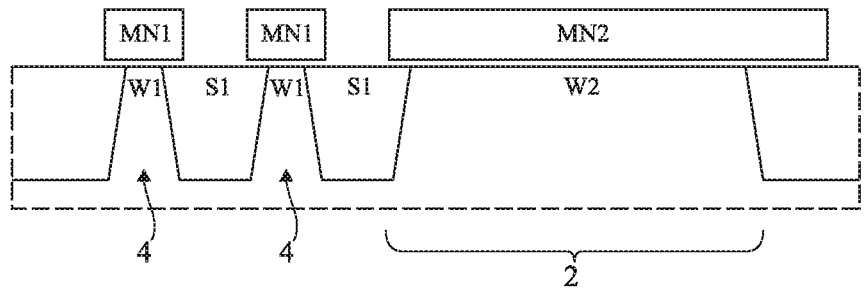
FIG. 2 is a cross-section view schematically showing two transistors of a first type and one transistor of a second type.

FIG. 2 is a cross-section view schematically illustrating two transistors 4 of a first type and one transistor 2 of a second type. The transistors 4 of the first type are characterized by a relatively small channel width and a relatively low threshold voltage due to the reverse narrow channel effect. The transistors of the second type are transistors capable of conducting a current greater than the current capable of flowing through the transistors of the first type and are characterized by larger channel width than that of the transistors of the first type. Due to their channel width, the transistors of the second type have a higher threshold voltage than the transistors of the first type.

In the example of FIG. 2, each transistor 4 comprises a channel having relatively low width W1, drain and source areas, not shown, and a gate MN1. Transistors 4 are isolated from each other and from transistor 2 by trenches S1.

Transistor 2 is a transistor having a channel of relatively large width W2 (as compared with width W1), drain and source areas, not shown, and a gate MN2.

Isolating trenches S1 for example have, in widthwise cross-section, a trapezoidal shape, for example, the shape of an isosceles trapeze. The upper and lower portions of each trench, that is, the area at the surface of the substrate having the trench formed therein, and the bottom of the trench, are parallel. Further, the lateral walls of all the trenches have the same slope, determined by the manufacturing process. Isolating trenches S1 have a similar depth whatever their width. This depth is determined by the manufacturing process or technology.

Figure 3:
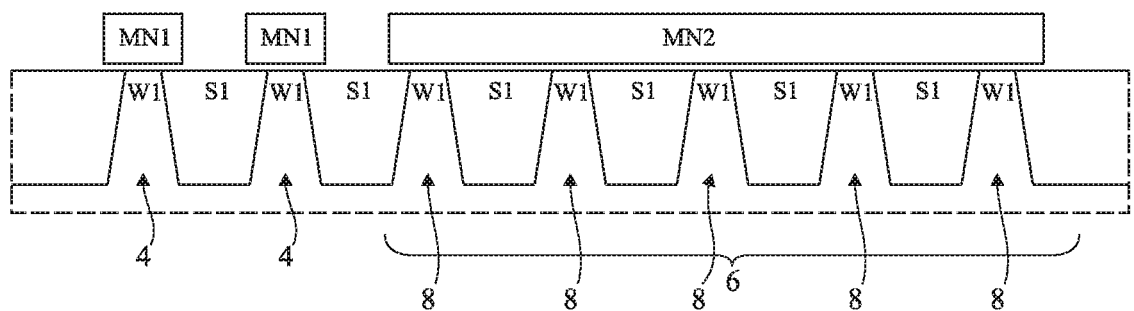
FIG. 3 is a cross-section view schematically showing a transistor formed of transistors connected in parallel associated with two transistors of the first type.

FIG. 3 is a simplified cross-section view of two transistors 4 of the first type and of a transistor 6 equivalent to transistor 2 of FIG. 2. Transistors 4 of FIG. 3 are the same as those of FIG. 2 and will not be described again.

Transistor 6 is formed of a plurality, here five, of elementary transistors 8, connected in parallel. All transistors 8 have a common gate MN2.

When it is here spoken of transistors connected in parallel, transistors having interconnected gates, interconnected source areas, and interconnected drain areas are considered.

Transistors 8 are transistors similar to transistors 4, that is, of same channel width and separated from one another by isolating trenches S1 having a maximum width equal to the maximum width of isolating trenches S1 separating transistors 4. Transistors 8, and thus transistor 6, have the same threshold voltage as transistors 4.

Such a structure is however surface consuming. Indeed, integrated circuit designers use up to now a same design rule for all isolating trenches.

Figure 4:
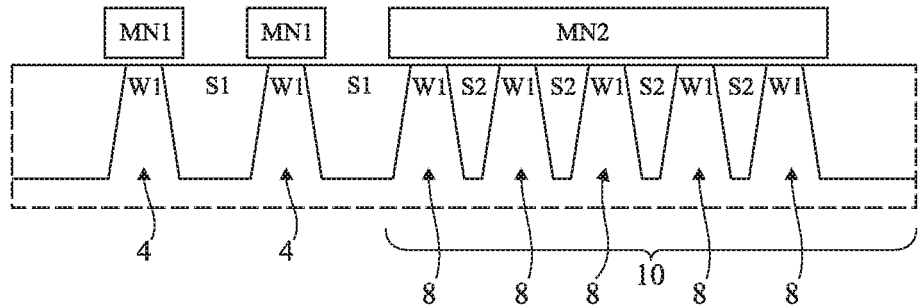
FIG. 4 is a cross-section view schematically showing an embodiment of a transistor formed of transistors in parallel.
Figure 5:
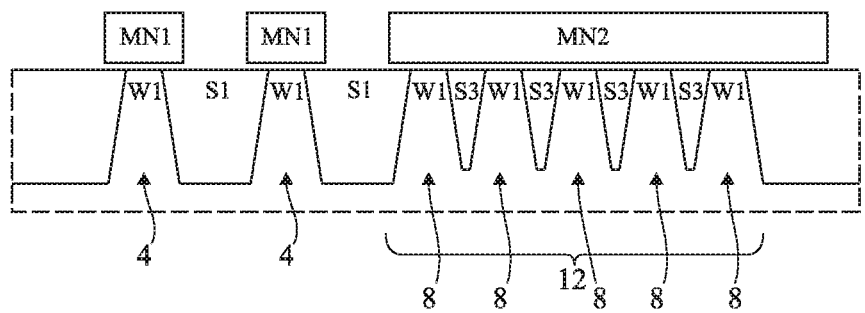
FIG. 5 is a cross-section view schematically showing another embodiment of a transistor formed of transistors in parallel.

FIGS. 4 and 5 are cross-section views schematically illustrating embodiments of a transistor equivalent to a transistor of the second type and comprising transistors 8 of the first type connected in parallel. FIGS. 4 and 5 further show the two transistors 4 such as they have been previously described.

In the embodiments of FIGS. 4 and 5, transistors 8 are connected in parallel, and have a common gate MN2. All source areas are at a same potential and all drain areas are at a same potential. There thus is no voltage difference to be withstood by the trenches located between transistors 8 connected in parallel and the leakage current problem is not posed. It is thus possible to decrease the width of the trenches separating transistors 8.

Such a decrease is not used for trenches separating transistors which are not connected in parallel. Indeed, they would not enable to properly isolate neighboring transistors and would cause leakage currents.

Thus, the trenches separating transistors 8 do not have the function of electrically isolating the transistors from one another, but only of separating them and of causing the reverse narrow channel effects enabling to decrease the threshold voltage.

FIG. 4 shows an embodiment of a transistor 10 formed of a plurality of transistors 8 (here five) connected in parallel. The channels of transistors 8 are separated from one another by isolating trenches S2. More particularly, trenches S2 have a maximum width smaller than that of the isolating trenches S1 used between transistors 4 and between transistor(s) 4 and transistor(s) 10. Trenches S2 may have a maximum width smaller than the widths of all the other isolating trenches of the chip. Trenches S2 for example have a width smaller than half the smallest width of trenches S1. Trenches S2 have a shape similar to that of trenches S1, that is, in widthwise cross-section, a trapezoidal shape, for example, the shape of an isosceles trapeze. Trenches S2 have, in FIG. 4, a depth similar to that of trenches S1 and independent from their width. Trenches S2 comprises a bottom parallel to the area at the surface of the substrate.

FIG. 5 shows another embodiment of a transistor 12 comprising transistors 8 (here, five) connected in parallel and separated by isolating trenches S3.

The maximum width of trenches S3 is smaller than that of trenches S2 (FIG. 4). The maximum width of trenches S3 is sufficiently small for the bottoms of trenches S3 not to be parallel to the surface of the substrate, and for the trench to have the shape of a triangle. Indeed, the slope of the lateral walls of all isolating trenches being constant for a same manufacturing process, there thus exists a value of the maximum trench width from which the lateral walls of a trench intersect at a depth smaller than the depth of trenches S1 or S2.

Trenches S3 for example have a depth in the range from the depth of trenches S1 to approximately half the depth of trenches S1.

Thus, whatever the embodiment, it can be considered that the maximum width (in practice, the width at the surface) of the isolating trenches separating the active areas (channels) of the transistors is, for the transistors connected in parallel (trenches S2 and S3), smaller than that of the other transistors (trenches S1). Further, the depth of trenches S2 or S3 has no influence upon the threshold voltage of the transistor.

The above-described embodiments enable to form MOS transistors formed of a plurality of elementary transistors connected in parallel, having a small threshold voltage and requiring a decreased surface with respect to transistors such as that shown in FIG. 3, taking advantage of the fact that, for transistors in parallel, one need not be concerned about the leakage current between transistors.

Specific embodiments have been described. Various alterations, modifications, and improvements will occur to those skilled in the art. In particular, transistors 10 and 12 have been described as being formed of five elementary transistors 8. The number of elementary transistors may however be different, to form a transistor 10 or 12 having the desired characteristics.

Further, the number of transistors of the first and second types as well as the number of transistors formed by transistors in parallel may be greater than the number of such transistors shown in the drawings.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electronic chip comprising:
    a plurality of first transistors connected in parallel so that gates of the first transistors are interconnected, drain areas of the first transistors are interconnected, and source areas of the first transistors are interconnected;
    a plurality of first isolating trenches, the first transistors being separated from one another by the first isolating trenches;
    a plurality of second transistors; and
    a plurality of second isolating trenches, the second transistors separated from one another by the second isolating trenches, wherein the first isolating trenches have a maximum width that is smaller than a maximum width of all the second isolating trenches.

2. The electronic chip of claim 1, wherein each first isolating trench has a depth that is independent from its maximum width.

3. The electronic chip of claim 1, wherein each first isolating trench has a depth that is dependent upon its maximum width.

4. The electronic chip of claim 1, wherein the second transistors are not connected in parallel.

5. The electronic chip of claim 1, wherein the first transistors and the second transistors have the same channel width.

6. The electronic chip of claim 1, wherein the maximum width of the first isolating trenches is smaller than half the smallest maximum width of the second isolating trenches.

7. The electronic chip of claim 1, wherein the first isolating trenches have a cross-section shape of an isosceles trapeze.

8. The electronic chip of claim 1, wherein the first isolating trenches have a triangular cross-section.

9. The electronic chip of claim 1, wherein each second trench has a depth that is independent from its maximum width.

10. The electronic chip of claim 1, wherein the maximum width of the second isolating trenches is a function of a degree of isolation desired between the second transistors.

11. The electronic chip of claim 1, wherein the first transistors have a channel width that is a function of a desired threshold voltage.

12. The electronic chip of claim 1, comprising a plurality of transistors formed of first transistors.

13. The electronic chip of claim 1, wherein each of the second isolating trenches has a depth that is greater than a depth of each of the first isolating trenches.

14. An electronic chip comprising:
    a semiconductor substrate;
    a plurality of transistors disposed at a surface of the semiconductor substrate, wherein the plurality of transistors includes a plurality of first transistors connected in parallel with each other and a plurality of second transistors that are not connected in parallel with any other transistor of the plurality of transistors, each transistor of the plurality of transistors having a channel area disposed in the semiconductor substrate;
    a plurality of small isolating trenches disposed in the semiconductor substrate so that, for each first transistor, the channel area is separated from the channel area of an adjacent first transistor by a respective one of the small isolating trenches; and
    a plurality of large isolating trenches disposed in the semiconductor substrate adjacent, each large isolating trench being adjacent to the channel area of a respective one of the second transistors, wherein each of the small isolating trenches has a width that is smaller than a width of all of the large isolating trenches.

15. The electronic chip of claim 14, wherein the first transistors and the second transistors have the same channel width.

16. The electronic chip of claim 14, wherein the first transistors and the second transistors have the same threshold voltage.

17. The electronic chip of claim 14, wherein each of the small isolating trenches has a width that is smaller than half of a width of all of the large isolating trenches.

18. The electronic chip of claim 14, wherein each of the plurality of small isolating trenches have a first depth, wherein each of the plurality of large isolating trenches have a second depth deeper than the first depth.

19. An electronic chip comprising:
    a first transistor formed of a plurality of transistors connected in parallel, the first transistor having a source area that is separated from a drain area by a channel area and also having a gate region overlying and insulated from the channel area, the source area, drain area and the channel area of the first transistor each having a first width;
    a second transistor having a source area that is separated from a drain area by a channel area and also having a gate region overlying and insulated from the channel area, the source area, the drain area and the channel area of the second transistor each having a second width that is smaller than the first width;
    an isolating trench separating the source area of the first transistor from the source area of the second transistor, separating the drain area of the first transistor from the drain area of the second transistor, and separating the channel area of the first transistor from the channel area of the second transistor; and
    a plurality of small isolating trenches separating the source area, the drain area and the channel area of the first transistor into source areas, drain areas and channel areas of the plurality of transistors connected in parallel a plurality of regions, each small isolating trench having a width that is smaller than a width of the isolating trench.

20. The electronic chip of claim 19, wherein each of the small isolating trenches has a width that is smaller than half of the width of the isolating trench.

21. The electronic chip of claim 19, wherein the first transistor and the second transistor have the same threshold voltage.

22. An electronic chip comprising:
a first transistor having a source area that is separated from a drain area by a channel area and also having a gate region overlying and insulated from the channel area, the source area, drain area and the channel area of the first transistor each having a first width;
a second transistor having a source area that is separated from a drain area by a channel area and also having a gate region overlying and insulated from the channel area, the source area, the drain area and the channel area of the second transistor each having a second width that is smaller than the first width; and
an isolating trench separating the source area of the first transistor from the source area of the second transistor, separating the drain area of the first transistor from the drain area of the second transistor, and separating the channel area of the first transistor from the channel area of the second transistor;
wherein the first transistor comprises a plurality of elementary transistors connected in parallel, the channel area of the first transistor being subdivided so that each elementary transistor has an elementary channel area that underlies the gate region and has the second width.

23. The electronic chip of claim 22, wherein the first transistor and the second transistor have the same threshold voltage.

24. The electronic chip of claim 22, wherein the first transistor comprises five elementary transistors.

\* \* \* \* \*

UNITED STATES PATENT AND TRADEMARK OFFICE
CERTIFICATE OF CORRECTION

PATENT NO. : 10,892,321 B2  
APPLICATION NO. : 16/059654  
DATED : January 12, 2021  
INVENTOR(S) : François Tailliet Page 1 of 1

It is certified that error appears in the above-identified patent and that said Letters Patent is hereby corrected as shown below:

In the Claims

In Column 6, Line 59, Claim 19, delete "a plurality of regions".

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*